United States Patent
Beukman et al.

(10) Patent No.: US 11,428,925 B2
(45) Date of Patent: Aug. 30, 2022

(54) POSITION METROLOGY APPARATUS AND ASSOCIATED OPTICAL ELEMENTS

(71) Applicant: ASML Netherlands B.V., Veldhoven (NL)

(72) Inventors: Arjan Johannes Anton Beukman, Breda (NL); Alessandro Polo, Arendonk (BE); Henricus Petrus Maria Pellemans, Veldhoven (NL); Nitish Kumar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 306 days.

(21) Appl. No.: 16/731,249

(22) Filed: Dec. 31, 2019

(65) Prior Publication Data

US 2020/0209608 A1 Jul. 2, 2020

Related U.S. Application Data

(60) Provisional application No. 62/787,201, filed on Dec. 31, 2018.

(30) Foreign Application Priority Data

Mar. 28, 2019 (EP) .................................... 19165908

(51) Int. Cl.
*G02B 26/00* (2006.01)
*G03F 7/20* (2006.01)
*G01B 11/27* (2006.01)

(52) U.S. Cl.
CPC .......... *G02B 26/001* (2013.01); *G01B 11/272* (2013.01); *G03F 7/7015* (2013.01)

(58) Field of Classification Search
CPC ... G02B 26/00; G03F 7/7015; G03F 7/70616; G03F 7/70633
See application file for complete search history.

(56) References Cited

U.S. PATENT DOCUMENTS 6,961,116 B2 11/2005 Den Boef et al.
7,145,640 B2 * 12/2006 Voorma .............. G03F 7/70558
355/69

(Continued)

FOREIGN PATENT DOCUMENTS

EP    1 914 583 A2    4/2008
JP    H07283123 A    10/1995

(Continued)

OTHER PUBLICATIONS

International Search Report and Written Opinion of the International Searching Authority directed to related International Patent Application No. PCT/EP2019/084725, dated Jan. 21, 2020; 14 pages.

*Primary Examiner* — Hung V Nguyen
(74) *Attorney, Agent, or Firm* — Sterne, Kessler, Goldstein & Fox P.L.L.C.

(57) ABSTRACT

Disclosed is a metrology apparatus comprising an optical element configured to receive at or near a pupil plane of the metrology apparatus, at least first radiation comprising a first higher diffracted order and second radiation comprising a zeroth order resulting from illumination of a metrology target with radiation; and to direct said first radiation and second radiation together in a first direction. The metrology apparatus is further configured to form at least a first image of a first interference pattern, the first interference pattern resulting from interference of said first radiation and second radiation at an image plane.

3 Claims, 6 Drawing Sheets

(56) References Cited

U.S. PATENT DOCUMENTS

| | | |
|---|---|---|
| 8,829,478 B2 | 9/2014 | Ershov |
| 2006/0033921 A1 | 2/2006 | Den Boef et al. |
| 2006/0066855 A1 | 3/2006 | Boef et al. |
| 2007/0013921 A1 | 1/2007 | Pellemans et al. |
| 2009/0195768 A1 | 8/2009 | Bijnen et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0194649 A1 | 8/2013 | Zhou |
| 2013/0258310 A1 | 10/2013 | Smilde et al. |
| 2013/0271740 A1 | 10/2013 | Quintanilha |
| 2015/0355554 A1 | 12/2015 | Mathijssen |

FOREIGN PATENT DOCUMENTS

| | | |
|---|---|---|
| TW | 201244305 A | 11/2012 |
| WO | WO 2009/078708 A1 | 6/2009 |
| WO | WO 2009/106279 A1 | 9/2009 |
| WO | WO 2013/178422 A1 | 12/2013 |
| WO | WO 2015/051970 A1 | 4/2015 |

\* cited by examiner

POSITION METROLOGY APPARATUS AND ASSOCIATED OPTICAL ELEMENTS

CROSS-REFERENCE TO RELATED APPLICATIONS

This application claims benefit of U.S. Provisional Patent Application No. 62/787,201, filed Dec. 31, 2018. This application claims priority of European Application No. 19165908.5, filed on Mar. 28, 2019 and are incorporated herein in their entirety by reference.

FIELD OF THE INVENTION

The present invention relates to apparatuses for measuring positional information in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer. A type of sensor widely used in current lithographic apparatus is based on a self-referencing interferometer as described in U.S. Pat. No. 6,961,116 (den Boef et al). Generally marks are measured separately to obtain X- and Y-positions. However, combined X- and Y-measurement can be performed using the techniques described in published patent application US 2009/195768 A (Bijnen et al). Modifications and applications of such sensors are described in US2015355554A1 (Mathijssen), WO2015051970A1 (Tinnemans et al). The contents of all of these publications are incorporated herein by reference.

In order to monitor the lithographic process, parameters of the patterned substrate are measured. Parameters may include, for example, the overlay error between successive layers formed in or on the patterned substrate. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

It is increasingly desirable to perform alignment on smaller targets (alignment marks) than presently used.

SUMMARY OF THE INVENTION

In a first aspect of the invention, there is provided a metrology apparatus comprising an optical element configured to receive at or near a pupil plane of the metrology apparatus, at least first radiation comprising a first higher diffracted order and second radiation comprising a zeroth order resulting from illumination of a metrology target with radiation; and to direct said first radiation and second radiation together in a first direction; the metrology apparatus being further configured to form at least a first image of a first interference pattern, said first interference pattern resulting from interference of said first radiation and second radiation at an image plane.

In a second aspect of the invention there is provided an optical element having a plurality of optical surfaces comprising at least first optical surfaces having a first gradient in a first gradient direction and second optical surfaces having a second gradient in a second gradient direction, thereby being configured to direct different parts of an angularly resolved radiation incident thereon in at least a first direction or a second direction.

In a third aspect of the invention there is provided a variable attenuator comprising a first mirror element and second mirror element arranged sequentially a distance apart; and an actuator for varying said distance between said first mirror element and said second mirror element.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

Before describing embodiments of the invention in detail, it is instructive to present an example environment in which embodiments of the present invention may be implemented.

Figure 1:
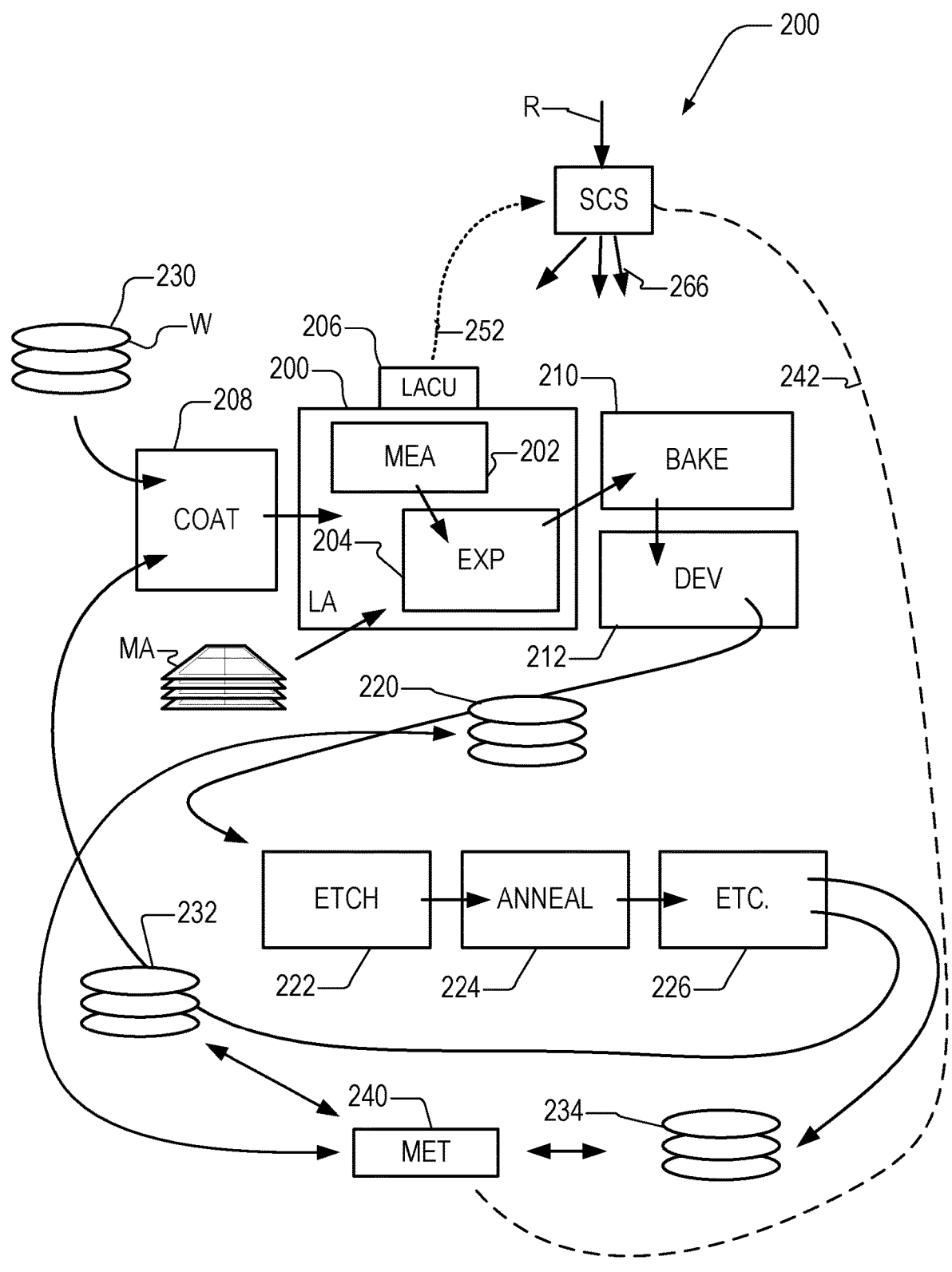
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged. In an alternative embodiment the measurement station is part of a separate metrology or alignment apparatus. In another embodiment the substrates are exchanged between the measurement station and the exposure station wherein each station comprises a separate substrate table to hold a substrate and the substrate is unloaded from the measurement substrate table, after the measurements on the substrate are performed, and then transferred to and loaded on the substrate table of the exposure station for the exposure process.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for performing measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

In performing alignment by measuring the position of alignment marks on the substrate using an alignment sensor, it would be desirable to reduce the size of the alignment mark pitches, for example to within the order of magnitude of 100 nm (more specifically within the range of 300-800 nm). It would also be desirable to reduce the area (footprint) of the alignment marks, so that many (e.g., hundreds, or even thousands) of them could be accommodated all over the wafer; including in-die, between product structures, where wafer space is "expensive".

Many present alignment sensors, such as those described in the publications mentioned in the introduction, require conjugate off-axis beams which are mutually coherent (e.g., they originate from the same single-mode radiation source). This allows for interference between corresponding diffracted orders using a dark-field imaging mode, where the zeroth order is typically blocked. Such dark-field imaging has been believed to provide superior performance to bright-field imaging. However, the use of spatially coherent radiation results in interference artifacts such as speckle effects, which have an impact on the alignment measurement, resulting in positional errors.

As such, a metrology device, suitable for alignment or position measurements, is proposed which uses spatially incoherent radiation, thereby obviating the speckle problem, while enabling alignment on small alignment marks of varying form. To resolve small mark pitches (e.g., smaller than the illumination wavelength), it is proposed to image in a bright-field mode, in which a higher diffraction order is interfered with the zeroth order in the image plane (e.g., on or near the detector). In an embodiment, attenuation of the zeroth order intensity is provided to improve contrast (e.g., to reduce the zeroth order intensity to a magnitude similar to that of the higher diffraction order it is being interfered with).

It is further proposed to provide such an alignment metrology device by a relatively minor modification to an existing metrology device designed predominately for post-exposure metrology (e.g., for overlay/focus/CD metrology). Such a metrology tool is able to perform dark-field metrology (e.g., DBO/DBF) with simultaneous (parallel) detection, or separate detection, of the corresponding diffraction orders (e.g., simultaneous detection of +1 and −1 diffraction orders). The modification may comprise a suitable optical element at or near the pupil plane, which directs at least one higher diffraction order and a zeroth order so that they interfere to form an interference pattern at the image plane, from which alignment can be determined (e.g., by position of the interference fringes). Pupil plane, in this context, may be taken to mean a Fourier image plane of the wafer or an optically conjugate plane thereof.

In an embodiment, the optical element may direct each of corresponding (e.g., +1 and −1) diffraction orders along with the zeroth order to different regions at the image plane so that each of these diffraction orders interferes with the zeroth order at the image plane to form corresponding interference patterns which can be separately imaged by a detector. In a particular, optional embodiment the optical element might also separate the diffraction orders by (e.g., orthogonal) direction. In a further, optional modification, the alignment metrology device may also comprise an attenuator for the zeroth order signal.

Also disclosed herein are suitable optical elements and attenuators for implementing such an alignment metrology device, and, in an embodiment, suitable for implementing such a device via a relatively simple modification of a present dark-field (e.g., post-exposure) metrology device, such as any of those cited in the introduction.

Such a metrology device will be able to measure small pitch targets using incoherent radiation, thereby obviating the speckle issue. Such a metrology device may be used as a position or alignment sensor for measuring substrate position (e.g., measuring the position of a periodic structure or alignment mark with respect to a fixed reference position). However, the metrology device is also usable for measurement of overlay (e.g., measurement of relative position of periodic structures in different layers, or even the same layer in the case of stitching marks). The metrology device is also able to measure asymmetry in periodic structures, and therefore could be used to measure any parameter which is based on a target asymmetry measurement (e.g., overlay using diffraction based overlay (DBO) techniques or focus using diffraction based focus (DBF) techniques).

To achieve this, the aforementioned dark-field scatterometer might be modified by replacing the zero order block (typically located in the pupil plane) with the aforementioned optical element which directs each of the positive first order diffraction beams in a different direction to the negative diffraction beams while also directing a zero order beam in each of these directions. This enables an image to be formed separately at an image plane from interfering each of the higher orders with a zeroth order. The illumination pupil may have a profile the same as presently used in many DBO/DBF applications, where radiation is transmitted through only one opposing pair of quadrants. A zero order attenuator may also be placed at the pupil plane, possibly forming part of the optical element.

Figure 2:
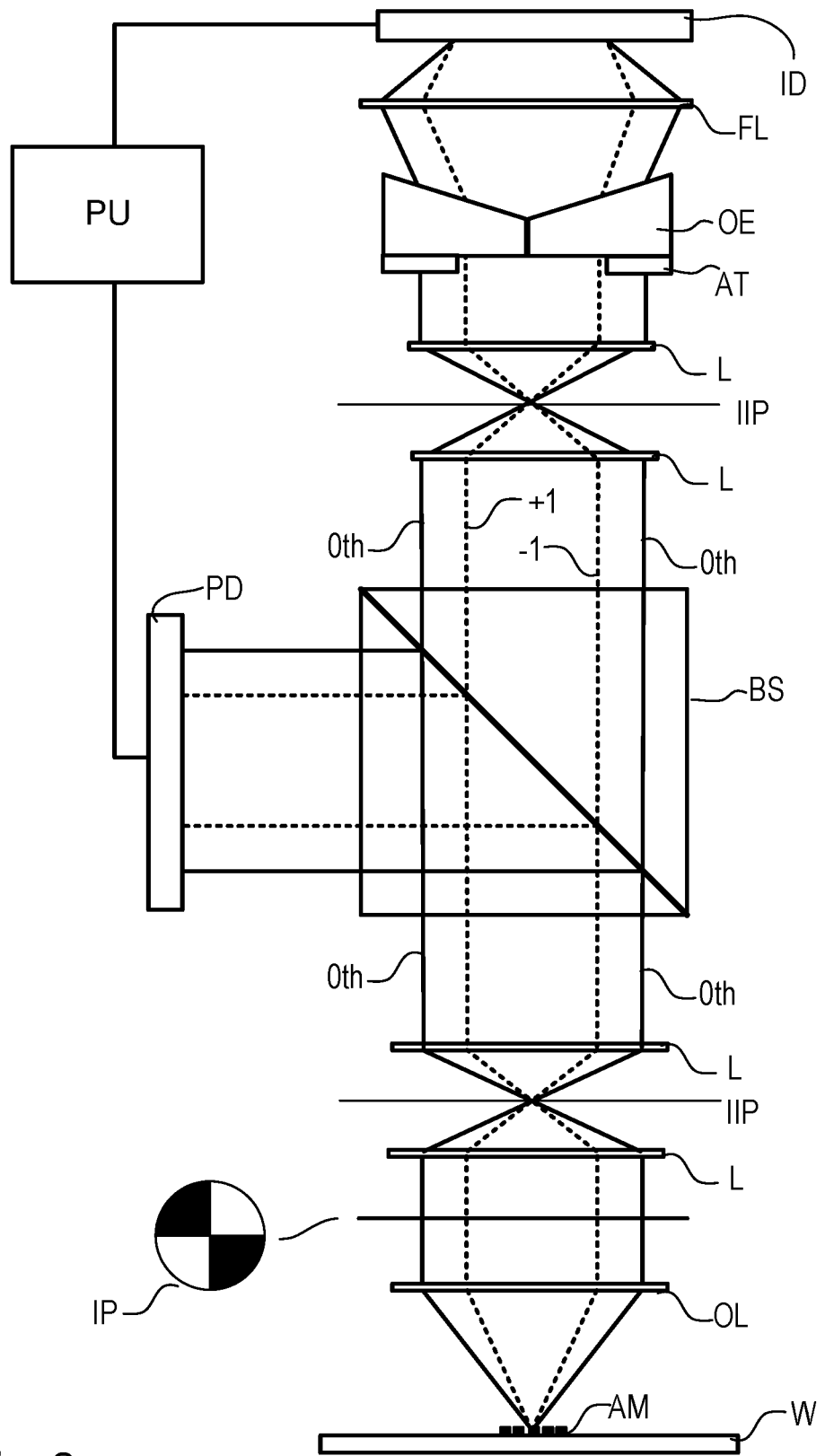
FIG. 2 is a schematic illustration of a metrology device according to an embodiment of the invention.

FIG. 2 shows a possible implementation of such a metrology device. The setup is a typical setup for dark field scatterometry, wherein an illumination pupil IP is obscurated, in a quartered profile as already described. A target or alignment mark AM is placed with substrate W normal to the optical axis of objective lens OL. The substrate W may be supported by a support (not shown). A ray of measurement radiation (not shown) impinging on alignment mark AM from an angle off the axis gives rise to a zeroth order ray (solid line 0th) and two first order rays (dotted lines +1 and −1). It should be remembered that with an overfilled small target, these rays are just one of many parallel rays covering the area of the substrate including alignment mark AM and other features. Note that the grating pitches of the alignment marks AM and the illumination angles can be designed or adjusted so that the first order rays entering the objective lens OL are closely aligned with the central optical axis. The rays illustrated in FIG. 2 are shown somewhat off axis, purely to enable them to be more easily distinguished in the diagram.

At least the 0 and +1 orders diffracted by the alignment mark AM on substrate W are collected by objective lens 16 and directed back, optionally via various arrangements of lenses L, e.g., to focus onto one or more intermediate image planes IIP. Optionally, a pupil branch is provided, comprising a beam splitter (or flip mirror) BS, and pupil detector PD connected to a processing unit PU. An imaging branch comprises an imaging element or final lens FL for focusing images of the target onto an imaged detector.

The elements of the metrology device described above are generally common with the aforementioned dark field imaging devices already known. In a typical dark field scatterometry setup, the illumination profile shown here allows for detection of only higher diffracted orders, whilst the specular reflected orders are blocked in reaching the sensor. The difference here is the provision of optical element OE in the pupil plane which directs the +1 diffracted order (first radiation) and (a first portion of the) zeroth order (second radiation) in a different (e.g., opposite) direction to the −1 diffracted order (third radiation) and (second portion of the) zero order. In this way, the pupil can be focused at the image plane to form separate interference images: a first interference pattern of the +1 diffracted order with zeroth order on a first region of image detector ID and a second interference pattern of the −1 diffracted order with zeroth order on a second region of image detector ID. Note here, therefore, there is no zero order block (the apparatus is not being operated as a dark field apparatus). Optionally, however, an attenuator AT may be provided which attenuates the intensity of the zeroth order to be at a level similar to that of the captured (+1, −1) diffracted orders. This can be done per target direction, such that +1 diffracted order from an orthogonally arranged grating (fourth radiation) can be used to form a third interference pattern with the zeroth order and a −1 diffracted order from an orthogonally arranged grating (fifth radiation) can be used to form a fourth interference pattern with the zeroth order.

It will be appreciated that FIG. 2 is purely a diagram of an exemplary setup to illustrate the basic principle. Aspects of detail, such as the number, location and type of lenses/lens elements in the optical path may vary from that shown. For example, one or more of lenses L, OL, FL may comprise a lens system having multiple lenses/other optical elements, and/or may be reflective rather than transmissive. For example, the final lens FL be dispensed with, and instead the "wedges" or sub-elements of optical element may be provided with focusing capability (e.g., each comprise lenses) to also do the focusing in addition to the directing.

Figure 3A:
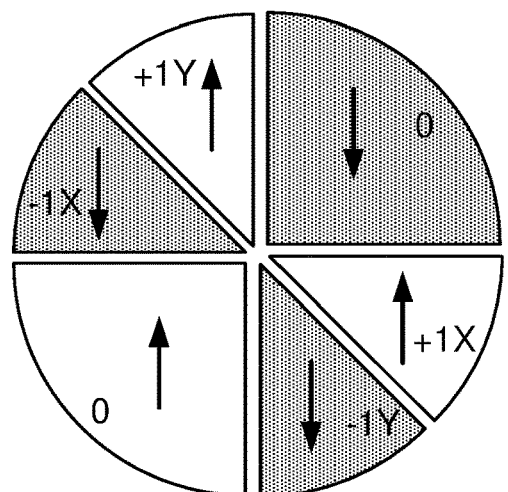
FIGS. 3(a)-3(f) are schematic illustrations of three alternative optical elements according to an embodiments of the invention and usable in a metrology device of FIG. 2, and corresponding alignment images.

FIG. 3(a) shows a first embodiment of optical element OE. Optical element OE is configured in such a way as to assure that (e.g., after focusing) the zeroth order and a first order overlap in or near the image plane IP so as to form an interference pattern on the detector at that image plane. The optical element in this embodiment comprises six regions defined by 6 wedges or a six-face wedge (a single element with six faces, each angled in one of two directions) or equivalent. The optical element is contoured such that the zeroth order 0 and the positive diffraction orders +1X and +1Y are directed in a first direction such that they can be focused on a first, (e.g., upper in the example here) region on the detector (detection plane) and that that the zeroth order 0 and the negative diffraction orders −1X and −1Y are directed such that they can be focused on a second, (e.g., lower) region on the detector. The arrows therefore indicate the direction of the wedge gradient (up indicates positive gradient, down indicates negative gradient) of each region. The specific shape of the optical element, and whether the wedges are realized by one element, six separate elements (or another number of elements) is not important. Note that the shading in FIG. 3(a) indicates the two groups of wedge regions, i.e., by direction or by the orders which will be interfered in the image plane; it does not signify intensity in any way.

Figure 3B:
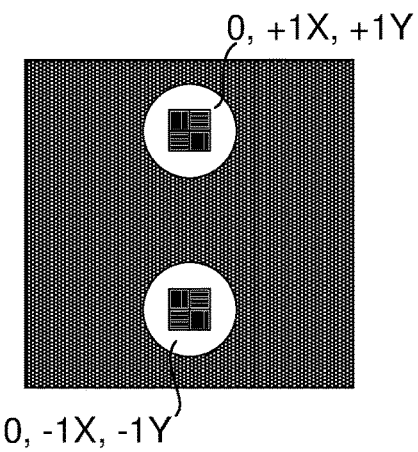

FIG. 3(b) is an example of the resultant image. The alignment mark in this example has a form similar to a typical DBO type arrangement (but in one layer) of two X direction gratings and 2 Y direction gratings, diagonally opposed. By re-imaging the pupil after the 6-face optical element, two displaced images are created which are incoherent with each other. When the first and the zeroth order overlap, fringes will be formed which are imaged on the detector. Monitoring the change in phase of these fringes when the wafer with the alignment mark moves, gives a measurement of the alignment position.

Figure 3C:
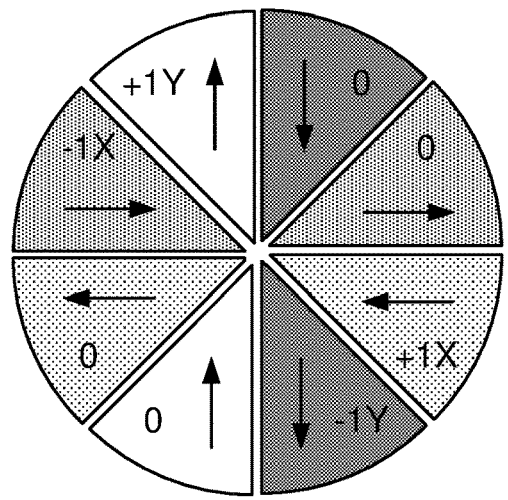
Figure 3D:
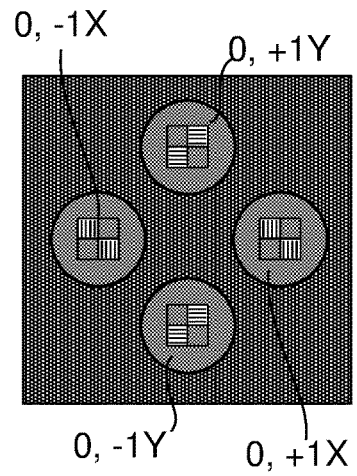

FIG. 3(c) shows a second embodiment of the optical element OE, comprising 8 regions defined by wedges or wedge faces. The arrows and shading again signify the gradient direction and grouping respectively. In this embodiment, the wedge faces are grouped in four directions, thereby directing a zero order and a different one of the first direction orders to a respective one of four directions, such that they can be separately focused on four different regions on the detector to form four interference images. As can be seen by FIG. 3(d), the image plane now comprises four images of the alignment mark, each formed from interference of the zero order with a different one of the first orders, to form an interference pattern. The four separate incoherent images enable more information on mark asymmetry to be determined from the relative intensities of the images. This will be described in more detail below.

Furthermore, this four-image embodiment makes it possible to separate defocus effects from mark displacement. Each individual interference pattern will shift as a function of defocus. However, this shift will be equal in magnitude and opposite in direction for "opposite images" (i.e., fringes in the 0, +1X image and 0, −X image will shift in the opposite direction, by an equal magnitude); the same is true for the Y direction images. Thus, an aligned position shift is seen as a common (same direction) shift of the two separate interference images; whereas a focus offset will result in an opposite shift.

Figure 3E:
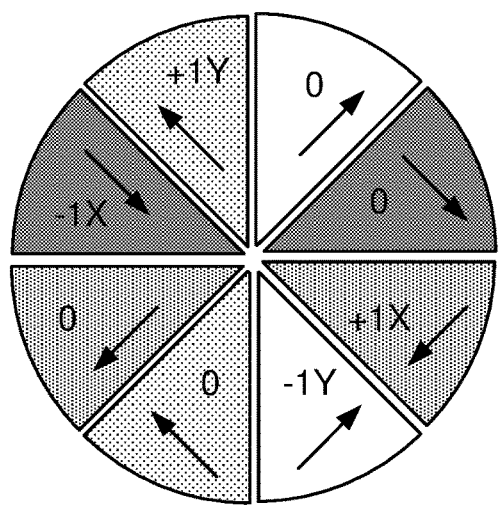
Figure 3F:
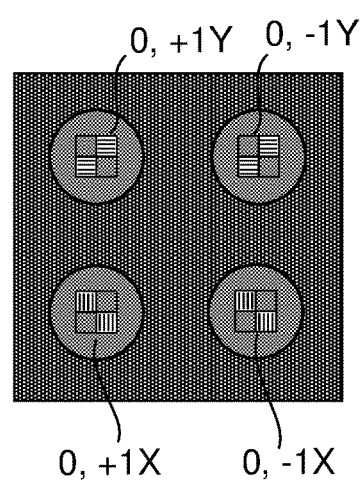

The orientation and order of the wedges can be chosen with consideration to one or more of a number of factors, including minimizing image-to-image crosstalk, maximizing image separation, optimizing detector (camera) filling and/or optimizing wedge manufacturability. By way of a further example, FIG. 3(e) shows a further 8 face embodiment, where the wedges have gradients aligned 45 degrees or orthogonal multiples thereof, with respect to the optical axis. The resultant image is shown in FIG. 3(f). An advantage of this arrangement is a better area filling of the image on the detector/camera. Therefore less camera area is required for the image arrangement in FIG. 3(f), with respect to the case of FIG. 3(d).

It will be appreciated that the specific arrangement of wedge faces, their order and orientation can be varied from the example shown, within the parameters of achieving interference between at least one first order with the zeroth order at the detector, either per direction or even only for a single direction (two direction x/y targets are optional, and the proposed system encompasses single direction alignment sensing on single direction alignment marks). A single diffraction image (per direction) enables the imaged diffraction fringes (i.e., phase of the diffraction pattern) to be compared to a fixed reference.

Alignment, therefore, can be determined by comparing a position determined from the pattern to a position obtained from measurement of a fixed reference (e.g., transmission image sensor (TIS) fiducial) in a known manner. A single fringe pattern (e.g., from a single grating alignment mark), or single pattern per direction (e.g., from a two grating alignment mark), can be used for alignment. However, when multiple images are present (per direction) the distance between multiple images can also be used as a reference. Another option for performing alignment in two directions may use an alignment mark having a single 2D periodic pattern. Also, non-periodic patterns could be measured with the metrology device described herein. Another alignment mark option may comprise a four grating target design, such as corresponding to the images of FIG. 3, which is similar to that commonly used for measuring overlay, at present (e.g., DBO targets). As such, targets such as these are typically already present on wafers, and therefore similar sampling could be used for alignment and overlay. Such alignment methods are known and will not be described further.

While one image is sufficient to obtain a position of the target using an appropriate calibration, in practice such a single image may be too sensitive to defocus effects. Therefore, the imaging of at least two interference patterns is preferred (e.g., averaging of separate images to give a more robust alignment signal). More specifically, to obtain the aligned position for an alignment mark it is proposed to extract a first position value x1 from a first image and second position value x2 from a second (opposite) image. The position of the mark is determined to be the average between these two values: (x1+x2)/2.

Because the proposed apparatus, in at least some embodiments, captures at least a first image formed from the +1 diffraction order and second image formed from the −1 diffraction order (in each case interfered with the zeroth order), a comparison of intensities in the resultant images can provide information on mark asymmetry (e.g., unintentional process asymmetries in the alignment mark, which are designed to be symmetrical, such as floor tilts or unequal side wall angles). A measure of the effect of mark asymmetry may be determined from this intensity comparison (e.g., the intensity difference between the first image and second image). Such an intensity difference (or intensity asymmetry) or other comparison can then be used to correct an alignment position measurement using the alignment mark. The techniques used to measure process asymmetry may be similar to those for measuring overlay using present post-processing metrology tools. The ability to measure asymmetry means that overlay (or focus) can also be measured using the same tool on the same targets, using known diffraction based overlay(focus) techniques.

In FIG. 3(b), the image is depicted as resulting from an arrangement where there is no attenuation of the zeroth order (the shading in FIGS. 3(b), 3(d) and 3(f) signifies intensity). Because of this, contrast suffers due to the brightness of the non-interfering zero order light (signified by the white circle around each image) on the detector. FIGS. 3(d) and 3(f) both show images resulting from arrangements where the zero order is attenuated, improving contrast of the interference pattern (fringes) within each image, and therefore the signal to noise ratio. Usually the zeroth order has a much stronger intensity than the intensity of any diffracted order. As such, the optical element may further comprise an attenuator, to balance the intensity ratio between the zeroth and the first diffracted order (e.g., so that the zeroth order intensity is within 10% of any diffracted order). Note that the attenuation may be applied to (or used in combination with) the optical element of FIG. 3(a) or any other suitable optical element.

In an embodiment, the attenuation may be provided by applying an attenuation filter to the zeroth order wedges. Such a filter may have less than 20% transmission, less than 10% transmission or less than 5% transmission (e.g., 4% transmission). One possible filter implementation comprises using static neutral density (ND) filters. Such ND filters may be provided on a filter wheel or other such arrangement, to enable selection of the desired attenuation. Another possible filter implementation includes a spatial light modulator (e.g., liquid crystal on silicon—LCoS) to dynamically vary attenuation in a continuous manner.

Figure 4:
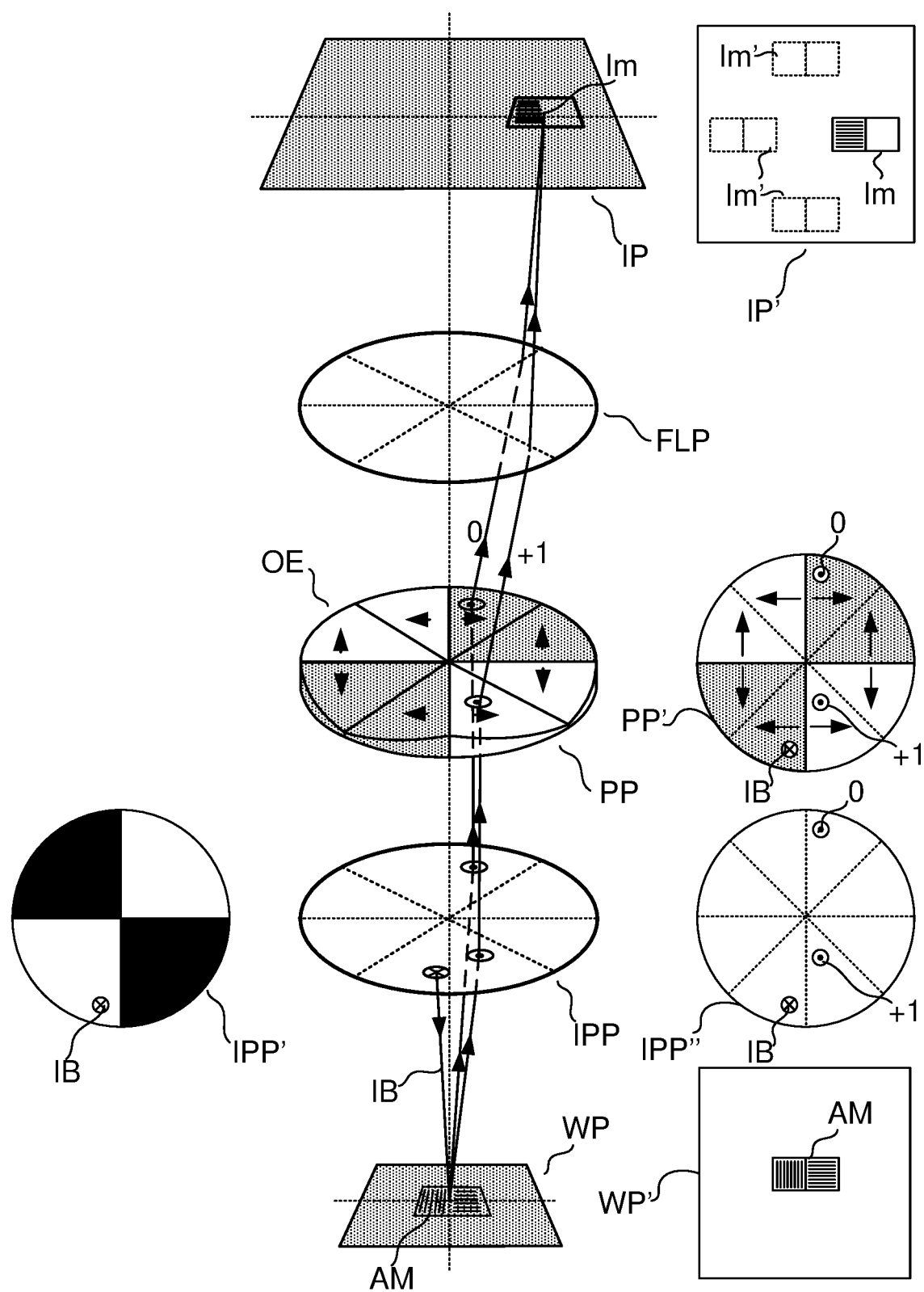
FIG. 4 is a schematic illustration of a first order beam and zeroth order beam through a metrology device as illustrated in FIG. 2.

FIG. 4 illustrates a working arrangement of the apparatus of FIG. 2, illustrating the path of a zero order beam 0 and a first order beam +1 through the system, following illumination by illumination beam D3. Five planes are illustrated, respectively from bottom to top, the wafer or substrate plane WP comprising alignment mark AM, the illumination pupil plane IPP, the pupil plane PP which comprises the optical element OE, the focusing plane FLP comprising the final lens, and the image plane (or detector plane) IP. In the center of the diagram, a (simplified) perspective representation of the system is shown. To the left of this is the illumination pupil IPP' at the illumination pupil plane IPP shown from top-down (relative to the center illustration). To the right of the main perspective image are top-down representations at the wafer plane WP', illumination pupil plane IPP''', pupil plane PP' and image plane IP' subsequent to diffraction. The pupil plane representations IPP''', PP' show the locations within the pupil of the illumination beam IB, zero order beam 0 and a first order beam +1. The wafer plane WP' representation shows that alignment mark AM position, and the image plane IP' representation shows the image Im position, along with corresponding images Im' (shown dotted) for the other interference patterns corresponding to the diffraction orders not explicitly shown. The arrows on the optical element OE again represent the direction of the wedge surface gradient.

For improved functioning of the concepts disclosed herein, the zeroth order intensity could be optimized per mark and/or stack. The required degree of attenuation can vary on scale of three orders of magnitude. A fixed set of different value ND-filters may not be ideal for this, and may lack the desired precision. In addition, a mechanical wheel based attenuator (to rotate the ND filters as required) as mentioned above is not desirable in an alignment sensor due to mechanical stability issues (vibrations etc.). Mechanical filters can also take a relatively long time to change.

Figure 5:
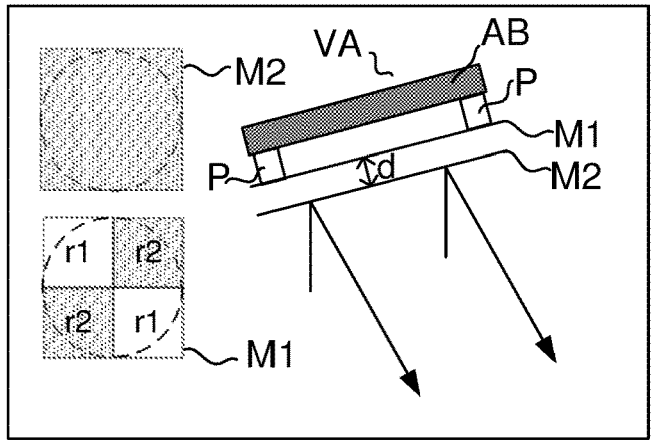
FIG. 5 is a schematic illustration of a variable attenuator and associated metrology device according to an embodiment of the invention.

FIG. 5 depicts an embodiment comprising a variable attenuator VA, in the form of a variable reflector, which aims to address these issues. The system components already described will not be described again. The reflective variable attenuator VA may be situated at a pupil plane of the sensor, as shown. Various embodiments are possible. The embodiment illustrated comprises a Fabry-Perot cavity as depicted in the inset of FIG. 5. The cavity comprises two semi-transparent mirrors elements M1, M2 separated by a small gap of length d. This gap length d can be adjusted by, for example, piezoelectric actuators P. Located behind the cavity there is an absorber plate AB comprising absorbing material. The first mirror element M1 has regions r1 with no attenuation, corresponding to the 1st order diffraction locations, (e.g., these regions have a mirror-like surface), and semi-transparent regions r2 having a reflectivity R. Mirror element M2 is semi-transparent having a reflectivity R.

By adjusting the height d, the reflectivity $R_{tot}$ of the cavity is tuned according to:

$$R_{tot} = 1 - T = 1 - \frac{1}{1 + 4R/(1-R)^2(\sin 2\pi d/\lambda)^2}$$

where T is the transmission and R is the reflectivity of the semi-transparent mirrors. For the zeroth order, the transmitted light T is incident on a (at least near) perfect absorber AB and is absorbed completely. At the location of the 1st order, the top mirror is (at least as near as possible to) 100% reflecting, i.e., no (intended) attenuation.

It can be shown that (for example, with careful selection of reflectivity R (e.g., R=0.8) with respect to the relevant wavelength(s)) the variable reflectivity $R_{tot}$ of the cavity can be turned from 0 (perfect absorbing) to 0.99 (almost perfect reflection) by variation of the distance d. The travel range of the piezo actuator P should be, for example, between 40 nm and 60 nm with e.g., 1 nm precision. The separation of the mirrors can be maintained, for example, using feedback from a capacitive sensor and capacitor plates (not shown) on the two semi-transparent mirror elements M1, M2.

By using such an arrangement, spatial variable attenuation in reflection is achieved, with no change in polarization state and providing the possibility of attenuating only part of the pupil (i.e., the zeroth order part). There is no need for large number of ND filters and filter wheel. Thermal anchoring is better controlled as the attenuator is reflective, rather than transmissive.

The above examples have described a transmissive optical element. While this is largely effective, dispersion in the (e.g., glass) optical element causes varying deflection angles as a function of wavelength. These different angles translate to a shifted image on the detector, such that the use of a multiple color source simultaneously blurs the images on the detector perpendicular to fringe direction. As a result of this, surrounding structures blur and leak into the alignment target image, hindering precise extraction of alignment signal. In a number of the embodiments described above, the zeroth order is attenuated using an ND-filter. However, the difference in dispersion between ND-filter glass and transparent optical element (wedge) glass results in a greatly reduced contrast for some colors, which limits the source bandwidth which can be used for such embodiments.

Figure 6:
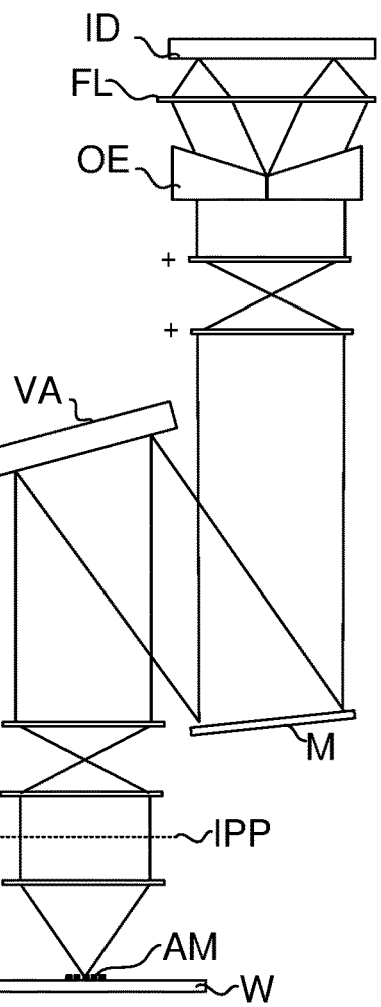
FIG. 6 is a schematic illustration of a first reflective optical element and associated metrology device according to an embodiment of the invention.
Figure 6:
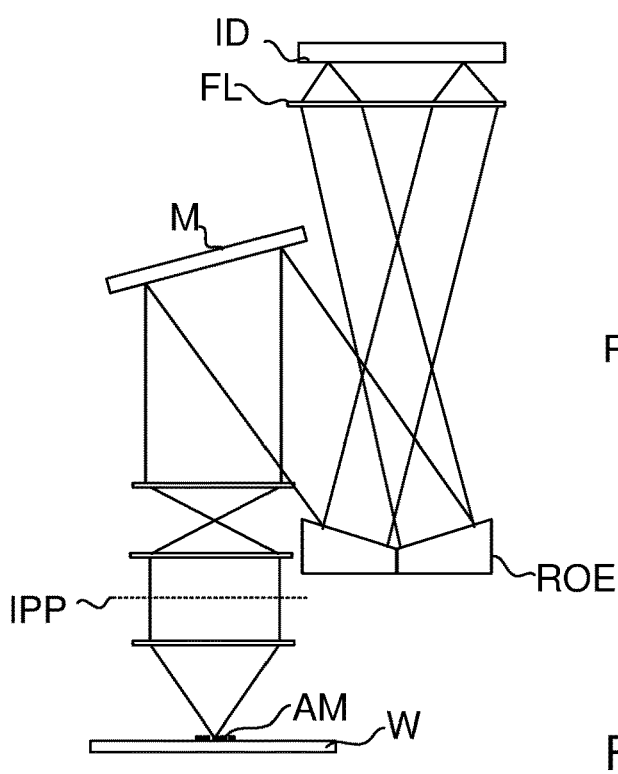
Figure 6:
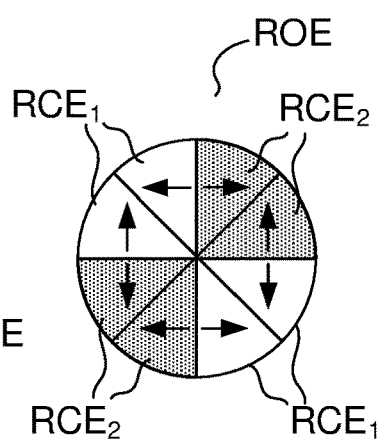

FIG. 6 illustrates a reflective optical element ROE which splits the pupil in eight sections, and sensor arrangement comprising such a reflective optical element ROE. The system components already described will not be described again. This reflective optical element ROE has zero (or very low) dispersion, and replaces the transparent optical element described in any of the preceding embodiments.

In a similar manner to the transmissive optical elements described above, the pupil area is split into eight parts (4 pairs) where each pair is subsequently imaged on the detector. The reflective component elements $RCE_1$, $RCE_2$ of the reflective optical element ROE directs each higher order (positive and negative, e.g., +1 and −1, per direction) with a portion of zeroth order in four separate directions, where again the arrows indicate the gradient of the (reflective) surface. The final lens FL focusses the resultant pupil into four images, each image being made from interference of a respective higher first order with the zeroth order. The reflective component elements $RCE_1$ are arranged to direct the higher diffraction orders (one per order) to different locations on the detector, and the (at least semi-) reflective component elements $RCE_2$ are arranged to direct the zero order to each of those locations on the detector. The reflective elements could be, for example, mirrors or prism elements or similar, based on total internal reflection. In an embodiment, reflective component elements $RCE_2$ may comprise attenuation of the zeroth order; for example, a partial transmissive mirror can be placed to attenuate the reflected light.

The reflective optical element ROE in FIG. 6 uses essentially the same or similar optical element (e.g., wedge) design as those described in FIGS. 3(c) and (e), but coated with, or made from, a reflective material (e.g., a metal). FIG. 6 also shows a possible location for such a reflective optical element ROE.

Figure 7A:
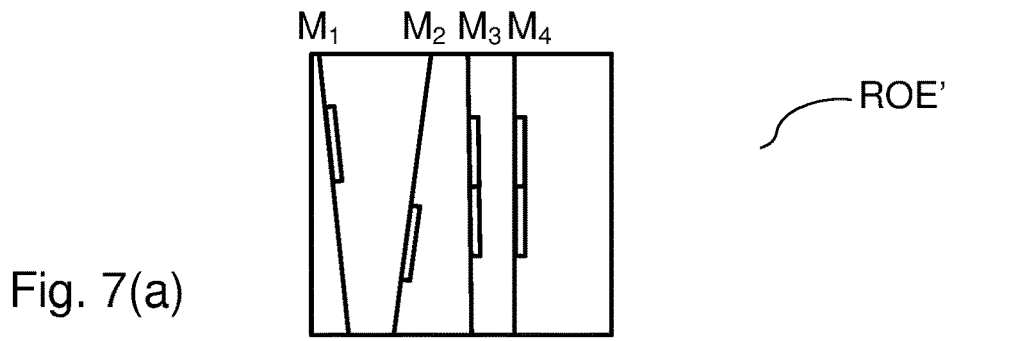
FIGS. 7(a)-7(c) are schematic illustrations of a second reflective optical usable in any the metrology device of FIG. 2, 5 or 6.
Figure 7B:
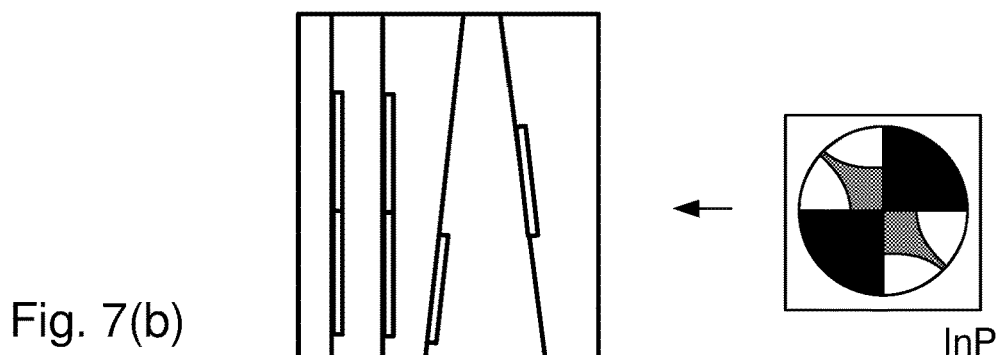
Figure 7C:
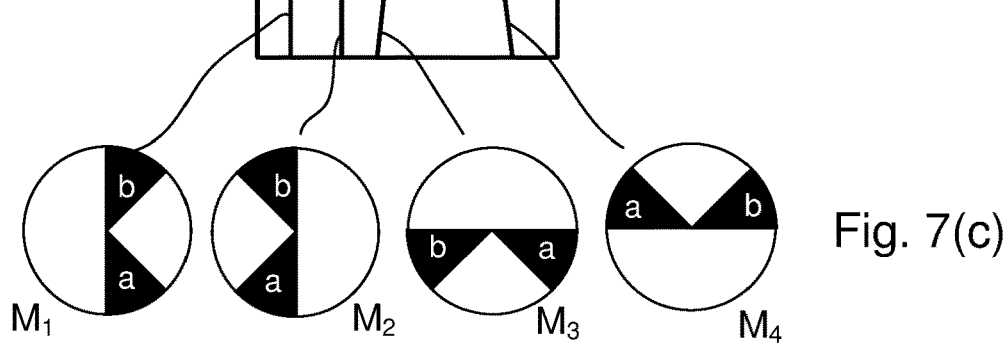

FIG. 7 illustrates an alternative reflective optical element ROE' arrangement, which can be located at the same location as reflective optical element ROE in FIG. 6. FIG. 7 shows reflective optical element ROE' comprising four sub-elements or mirror arrangements $M_1$, $M_2$, $M_3$, $M_4$ arranged sequentially. Each mirror arrangement $M_1$, $M_2$, $M_3$, $M_4$ is arranged to form a single one of the images (i.e., directs a respective higher diffractive order and zeroth order to different directions) from the input pupil InP. As such, each mirror corresponds to a single corresponding pair of reflective component elements $RCE_1$, $RCE_2$ of the reflective optical element ROE shown in FIG. 6. FIG. 7 shows (a) a top view and (b) a side view of the reflective optical element ROE', along with the mirror arrangements $M_1$, $M_2$, $M_3$, $M_4$ (FIG. 3(c)) within the pupil. FIG. 3(c) shows each mirror arrangement comprising a first mirror element a (for the higher diffraction order) and second mirror element b (for the zeroth diffraction order), with the rest of the pupil (unshaded part) being open or fully transparent. As before, each second mirror element b can be arranged to attenuate the zeroth order intensity; e.g., be implemented as a semi-transparent mirror.

Figure 8:
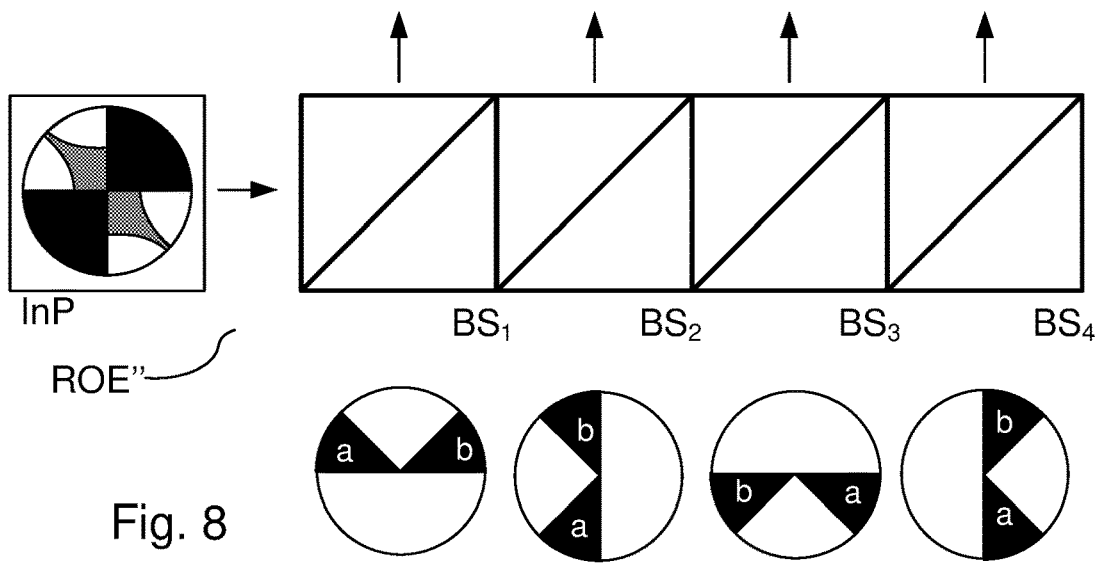
FIG. 8 is a schematic illustration of a third reflective optical usable in any the metrology device of FIG. 2, 5 or 6.

FIG. 8 illustrates another alternative reflective optical element ROE" arrangement, which again can be located at the same location as reflective optical element ROE in FIG. 6. In this arrangement, the four sub-elements comprise four beamsplitter cubes $BS_1$, $BS_2$, $BS_3$, $BS_4$. Similarly to FIG. 7, each beamsplitter cube $BS_1$, $BS_2$, $BS_3$, $BS_4$ comprises a first mirror element a (for the higher diffraction order) and second mirror element b (for the zeroth diffraction order), with the rest of the pupil (unshaded part) being fully transparent. As before, each second mirror element b can be arranged to attenuate the zeroth order intensity; e.g., be implemented as a semi-transparent mirror, or else attenuation can be applied after the beamsplitter cubes.

It can also be appreciated that a reflective version of the optical element illustrated in FIG. 3(a), or any other of the optical element arrangement disclosed or described herein (e.g., an optical element which forms a single image, or single image per direction). This applies to any of the reflective embodiments described herein, where it will be immediately apparent how to construct or arrange a six (or fewer) reflective surface version.

Note that any of the reflective optical elements described above can be used in combination with the variable attenuator VA described above, in which case it would not attenuate the zero order reflective surfaces (e.g., the reflectivity of all reflective surfaces would be similar or the same for the zero order parts of the pupil and diffracted order parts of the pupil).

Any mention of higher diffraction orders, or +1 and −1 orders can be extended more generally to mean other any other higher diffraction orders, e.g., other pairs of complementary orders such as +2 and −2 orders, +3 and −3 orders etc. The detector may be any suitable detector such as a CCD camera or similar. Multiple detectors may be used to detect each image on a separate detector.

Further embodiments according to the invention are described in below numbered clauses:

1. A metrology apparatus comprising:

an optical element configured to receive at or near a pupil plane of the metrology apparatus, at least first radiation comprising a first higher diffracted order and second radiation comprising a zeroth order resulting from illumination of a metrology target with radiation; and to direct said first radiation and second radiation together in a first direction;

said metrology apparatus being further configured to form at least a first image of a first interference pattern, said first interference pattern resulting from interference of said first radiation and second radiation at an image plane.

2. A metrology apparatus according to clause 1, further comprising an imaging element being located to receive at least the directed first radiation and second radiation from the optical element, and being configured to form at least said image at a first location at the image plane.

3. A metrology apparatus according to clause 2, wherein the optical element is configured to additionally receive third radiation comprising a second higher diffraction order, said second higher diffraction order being complementary to said first higher diffraction order; said optical element being further configured to:

direct said third radiation and second radiation together in a second direction such that said imaging element forms a second image of a second interference pattern, said second interference pattern resulting from interference of said third radiation and second radiation at the image plane.

4. A metrology apparatus according to clause 3, wherein the optical element is configured to additionally receive fourth radiation comprising a third higher diffraction order, said third higher diffraction order corresponding to said first higher diffraction order but diffracted from a metrology target or target portion orthogonal to that which diffracts said first higher diffraction order, and fifth radiation comprising a fourth higher diffraction order, said fourth higher diffraction order corresponding to said second higher diffraction order but diffracted from a metrology target or target portion orthogonal to that which diffracts said second higher diffraction order, and said imaging element is operable to image a third interference pattern resulting from interference of said fourth radiation and second radiation at the image plane, and a fourth interference pattern resulting from interference of said fifth radiation and second radiation at the image plane.

5. A metrology apparatus according to clause 4, wherein the optical element comprises a plurality of optical surfaces arranged within the pupil plane to direct different parts of the pupil plane in said first direction or said second direction, wherein said optical surfaces comprise at first optical surfaces having a first gradient in a first gradient direction and second optical surfaces having a second gradient in a second gradient direction.

6. A metrology apparatus according to clause 5, comprising three first optical surfaces for directing said first radiation, second radiation and fourth radiation in the first direction and three second optical surfaces for directing said second radiation, third radiation and fifth radiation in the second direction, such that said first interference pattern and second interference pattern are comprised in said first image and said third interference pattern and fourth interference pattern are comprised in said second image.

7. A metrology apparatus according to clause 4, wherein the optical element is configured to direct said first radiation in the first direction, said third radiation in the second direction, said fourth radiation in a third direction and said fifth radiation in a fourth direction, and to direct said second radiation to each of the first direction, second direction, third direction, and fourth direction, such that said first interference pattern comprised in said first image, said second interference pattern is comprised in said second image, said third interference pattern is comprised in a third image at a third location at said image plane and said fourth interference pattern is comprised in a fourth image at a fourth location at said image plane.

8. A metrology apparatus according to clause 7, wherein the optical element comprises a plurality of optical surfaces arranged within the pupil plane, said plurality of optical surfaces comprising four pairs of surfaces; comprising:

a first pair having a first gradient in a first gradient direction to direct said first radiation and second radiation in the first direction;

a second pair having a second gradient in a second gradient direction to direct said third radiation and second radiation in the second direction;

a third pair having a third gradient in a third gradient direction to direct said fourth radiation and second radiation in the third direction;

a fourth pair having a fourth gradient in a fourth gradient direction to direct said fifth radiation and second radiation in the fourth direction.

9. A metrology apparatus according to any preceding clause, wherein the optical element is transmissive.

10. A metrology apparatus according to any of clauses 1 to 8, wherein the optical element is reflective.

11. A metrology apparatus according to clause 10, wherein the optical element comprises a sequential arrangement of sub-elements.

12. A metrology apparatus according to clause 11, wherein the sequential arrangement of sub-elements comprise a sequential arrangement of mirrors or beam splitters, each sub-element configured to direct radiation for different parts of the pupil plane.

13. A metrology apparatus according to any preceding clause, comprising an attenuator for attenuating the intensity of said second radiation.

14. A metrology apparatus according to clause 13, wherein the attenuator is arranged to attenuate the part of the pupil plane corresponding to said second radiation.

15. A metrology apparatus according to clause 13 or 14, wherein said attenuator is comprised as part of, or a coating applied to, the optical element.

16. A metrology apparatus according to clause 13 or 14, wherein the attenuator comprises one or more filters arranged to filter the second radiation.

17. A metrology apparatus according to clause 13 or 14, wherein the attenuator comprises a variable attenuator.

18. A metrology apparatus according to clause 17, wherein the variable attenuator comprises a first mirror element and second mirror element arranged sequentially a distance apart; and an actuator for varying said distance between said first mirror element and said second mirror element.

19. A metrology apparatus according to clause 18, wherein the actuator is a piezo electric actuator.

20. A metrology apparatus according to clause 18 or 19, comprising an absorber material to absorb any radiation not reflected by said first mirror element and said second mirror element.

21. A metrology apparatus according to clause 18, 19 or 20, wherein said first mirror element comprises first regions of high reflectivity and second regions of semi-transparency, and said second mirror element is semi-transparent.

22. A metrology apparatus according to any of clauses 17 to 21, wherein the variable attenuator is located between the metrology target and the optical element.

23. A metrology apparatus according to any of clauses 13 to 22, wherein the attenuator attenuates the intensity of said second radiation to be within 10% of the intensity of any one of said first radiation, third radiation, fourth radiation or fifth radiation.

24 A metrology apparatus according to any preceding clause, comprising:
a detector operable to capture said image(s); and
a processor operable to determine positional information for said metrology target from said image(s).

25 A metrology apparatus according to clause 24, wherein the processor is operable to determine said positional information from the position of interference fringes in said image.

26. A metrology apparatus according to clause 24 or 25, wherein the processor is operable to compare intensities of two diffraction patterns from two complementary diffraction orders;
and use said comparison to determine asymmetry in the metrology target.

27. A metrology apparatus according to clause 26, use said determined asymmetry to correct said positional information.

28. A metrology apparatus according to any preceding clause, further comprising projection optics for projecting measurement radiation onto the metrology target and capturing at least the zeroth order and at least one higher order.

29. A metrology apparatus according to any preceding clause, configured as an alignment sensor for determining an aligned position of a substrate or reticle in a lithographic exposure or metrology process.

30. An optical element having a plurality of optical surfaces comprising at least first optical surfaces having a first gradient in a first gradient direction and second optical surfaces having a second gradient in a second gradient direction, thereby being configured to direct different parts of an angularly resolved radiation incident thereon in at least a first direction or a second direction.

31. An optical element according to clause 30, comprising three first optical surfaces and three second optical surfaces.

32. An optical element according to clause 30, comprising four pairs of surfaces; comprising:
a first pair having the first gradient in the first gradient direction;
a second pair having the second gradient in the second gradient direction;
a third pair having a third gradient in a third gradient direction; and
a fourth pair having a fourth gradient in a fourth gradient direction;
thereby being configured to direct different parts of an angularly resolved radiation incident thereon into one of the first direction, the second direction, a third direction or a fourth direction.

33. An optical element according to clause 30, 31 or 32, wherein the optical element is transmissive.

34. An optical element according to clause 30, 31 or 32, wherein the optical element is reflective.

35. An optical element according to clause 34, wherein the optical element comprises a sequential arrangement of sub-elements.

36. An optical element according to clause 35, wherein the sequential arrangement of sub-elements comprise a sequential arrangement of mirrors or beam splitters, each sub-element configured to direct different parts of the angularly resolved radiation.

37. An optical element according to any of clauses 30 to 36, comprising an attenuator for part of the angularly resolved radiation.

38. A variable attenuator comprising a first mirror element and second mirror element arranged sequentially a distance apart; and
an actuator for varying said distance between said first mirror element and said second mirror element.

39. A variable attenuator as claimed in claim 38, wherein the actuator is a piezo electric actuator.

40. A variable attenuator as claimed in claim 38 or 39, comprising an absorber material to absorb any radiation not reflected by said first mirror element and said second mirror element.

41. A variable attenuator as claimed in claim 38, 39 or 40, wherein said first mirror element comprises first regions of high reflectivity and second regions of semi-transparency, and said second mirror element is semi-transparent.

The terms "radiation" and "beam" used in relation to the metrology devices described herein encompass all types of electromagnetic radiation, in any wavelength range, including infrared wavelengths such as 1000-3000 nm wavelengths.

While the above description describes corrections for a lithographic apparatus/scanner, the determined corrections may also be used for any process and by any integrated circuit (IC) manufacturing apparatus in an IC manufacturing process, e.g., an etch apparatus, which has an effect on the position and/or a dimension of the structures formed within a layer.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A variable attenuator comprising:
   a first mirror element comprising a first region of high reflectivity and a second region of semi-transparency;
   a second semi-transparent mirror element arranged a distance apart from the first mirror element; and
   an actuator configured to vary the distance between the first mirror element and the second mirror element.

2. The variable attenuator of claim 1, wherein the actuator is a piezoelectric actuator.

3. The variable attenuator of claim 1, further comprising an absorber material configured to absorb any radiation not reflected by the first mirror element and the second mirror element.

* * * * *